(12) United States Patent
Truemper

(10) Patent No.: US 8,714,992 B2
(45) Date of Patent: May 6, 2014

(54) RECEPTACLE CONNECTOR HAVING A BASE PART WITH SEALING LIPS FITTED IN A HOUSING WALL

(75) Inventor: Thomas Truemper, Breitenbach (DE)

(73) Assignee: Wago Verwaltungsgesellschaft mbH, Minden (DE)

( * ) Notice: Subject to any disclaimer, the term of this patent is extended or adjusted under 35 U.S.C. 154(b) by 8 days.

(21) Appl. No.: 13/537,807

(22) Filed: Jun. 29, 2012

(65) Prior Publication Data
US 2013/0029518 A1    Jan. 31, 2013

(30) Foreign Application Priority Data
Jul. 5, 2011    (DE) .......................... 10 2011 106 853

(51) Int. Cl.
*H01R 13/52*    (2006.01)
(52) U.S. Cl.
USPC ........................................................ 439/275
(58) Field of Classification Search
USPC .................................. 439/395–425, 271–275
See application file for complete search history.

(56) References Cited

U.S. PATENT DOCUMENTS

| | | | | |
|---|---|---|---|---|
| 5,242,313 | A * | 9/1993 | Logerot et al. ................ | 439/404 |
| 6,116,952 | A * | 9/2000 | Nakata .......................... | 439/587 |
| 6,203,348 | B1 * | 3/2001 | Fukuda ......................... | 439/275 |
| 7,255,590 | B2 * | 8/2007 | Schremmer et al. .......... | 439/404 |
| 2006/0240701 | A1 * | 10/2006 | Schremmer et al. .......... | 439/404 |
| 2013/0183779 | A1 * | 7/2013 | Pachler et al. ................. | 438/28 |

FOREIGN PATENT DOCUMENTS

| | | |
|---|---|---|
| DE | 3248715 | 7/1984 |
| DE | 198 16 216 | 10/1999 |
| DE | 103 28 659 | 1/2004 |
| DE | 20 2004 013 335 | 9/2005 |
| DE | 10 2006 056 258 | 5/2008 |
| DE | 10 2009 014 514 | 10/2010 |
| EP | 0 631 344 | 12/1994 |
| GB | 1 587 998 | 4/1981 |
| GB | 2 268 641 | 1/1994 |

\* cited by examiner

*Primary Examiner* — Chandrika Prasad
(74) *Attorney, Agent, or Firm* — Renner, Otto, Boisselle & Sklar, LLP.

(57) ABSTRACT

A receptacle connector having a base part, which has at least one insulation displacement contact for making electrical contact with an electrical conductor, and having a top part, which has at least one conductor infeed opening for in each case one electrical conductor with which contact is to be made, and at least one contact accommodation opening, which in each case opens out into an associated conductor infeed opening, for accommodating an insulation displacement contact of the base part when the top part is fitted onto the base part. The receptacle connector is designed for fitting into a housing. For this purpose, the base part and/or the top part have sealing lips with a contour which is matched to an associated housing wall in order to fit the base part and/or the top part into a housing wall in a sealed manner.

10 Claims, 6 Drawing Sheets

RECEPTACLE CONNECTOR HAVING A BASE PART WITH SEALING LIPS FITTED IN A HOUSING WALL

The invention relates to a receptacle connector having a base part, which has at least one insulation displacement contact for making electrical contact with an electrical conductor, and having a top part, which has at least one conductor infeed opening for in each case one electrical conductor with which contact is to be made, and at least one contact accommodation opening, which in each case opens out into an associated conductor infeed opening, for accommodating an insulation displacement contact of the component when the top part is fitted onto the base part.

Two-part receptacle connectors of this kind for fitting into a housing wall are used, for example, for the electrical wiring of lamp ballast units.

In contrast to this, single-part receptacle connectors, which are fitted into accommodation openings of a housing wall, e.g. of a cast transformer or of a switchgear device, are described in DE 40 42 456 C1.

Electrical conductors can then be clamped to insulation displacement terminals of the receptacle connector.

Plug-in connectors, which can be fitted in a sealed manner into a housing opening, are disclosed in DE 32 48 715 A1, DE 27 53 145 A1, DE 10 2009 014 514 A1 and DE 10 2006 056 258 A1. A mating plug-in connector can then be fitted from the outside onto the plug-in connector fitted into the housing so that plug-in pins of the fitted plug-in connector engage in socket contacts of the mating plug-in connector.

A two-part electrical connection arrangement, in which electrical conductors are fitted into a separate housing cover and then fitted onto insulation displacement contacts of a plug-in socket region of the housing, is disclosed in DE 103 28 659 A1. The insulation displacement contacts are electrically conductively connected to contact pins which protrude from the housing. When the separate housing cover with the electrical conductors fitted therein is fitted onto the plug-in socket region of the housing, the electrical conductors are electrically conductively connected to the insulation displacement contacts, thus making an insulation displacement contact. This enables a cable to be tapped into CAN-Bus cables in the automobile industry, for example.

Starting from this point, it is the object of the present invention to create an improved receptacle connector which allows a simple insulation displacement connection of electrical cables to insulation displacement contacts of a base part and, at the same time, guarantees a reliable sealing of the interior of a housing into which the receptacle connector is fitted.

The object is achieved with the receptacle connector with the characteristics of claim 1.

The receptacle connector of the kind mentioned in the introduction is distinguished in that the receptacle connector is designed for fitting into a housing and for this purpose, the base part and/or the top part have sealing lips with a contour which is matched to an associated housing wall in order to fit the base part and/or the top part into a housing wall in a sealed manner.

A receptacle connector with insulation displacement contacts which differs from the electrical connection arrangement of DE 103 28 659 A1 in that the receptacle connector is designed for fitting into a housing and, for this purpose, sealing lips with which the base part and/or the top part can be fitted into the housing in a sealed manner are provided on the base part and/or on the top part, is therefore proposed.

When the base part with the sealing lips is fitted in a housing wall in a sealed manner, then the interior of the housing is already tightly sealed with respect to the outside. The top part with electrical conductors fitted thereto can then be fitted onto the base part for making insulation displacement contact with the electrical conductors without this affecting the sealing of the interior of the housing.

The interior can also be sealed by means of the top part, which is fitted into the associated housing wall in a sealed manner with the help of sealing lips on the top part when it is fitted onto the base part.

However, it is particularly advantageous when the base part has a base body made from electrically insulating plastic having a bottom part and having side walls which protrude from the bottom part. The at least one insulation displacement contact is then fitted into the bottom part and protrudes from the bottom part. The sealing lip is arranged circumferentially on at least part of the outer wall of the bottom part and on the outer wall of the side walls, enabling the base body to be fitted into a housing wall in a sealed manner with the help of the sealing lips.

As a starting point, the sealing lip formed on the bottom part enables this bottom part to be fitted into a housing in a sealed manner. The connecting chamber with the insulation displacement contacts (IDC contact) is therefore bounded on the inside in a sealed manner so that the conductor accommodating top part is fitted in the unprotected insulation displacement connection region, which is tightly sealed with respect to the interior, without requiring further sealing measures. This enables the conductor-accommodating top part to be fitted at a later date to a possibly encapsulated and completely manufactured unit for connecting the conductors. As an option, the base part in turn has a base body made from electrically insulating plastic having a bottom part, wherein the at least one insulation displacement contact is fitted into the base part and protrudes from the bottom part. In this embodiment, the sealing lip is arranged circumferentially on at least part of the outer wall of the top part, enabling the top part with the sealing lip to be fitted into a housing wall in a sealed manner when the top part is fitted onto the base part.

With this embodiment, it is also advantageous when the conductor infeed openings have circumferential elastic sealing lips. In this way, the electrical conductors can be fed into the conductor infeed openings and sealed with respect to the outside with the help of the elastic sealing lips of the insulation displacement contact regions and the transition to the base part.

The sealing lips for sealing within the meaning of the present invention are used to encapsulate the interior of the housing, e.g. with artificial resin, and to prevent artificial resin escaping to the outside. In addition, this has the advantage of keeping environmental influences of the exterior away from the interior. In particular, this prevents an ingress of moisture from the environment into the interior of the housing or the insulation displacement contact region of the insulation displacement contacts. The sealing lips are therefore used to ensure suitable protection against ingress and, for this purpose, to realize a required IP protection class (Ingress Protection) of the equipment housing and/or of the receptacle connector against touch, foreign bodies and water. These IP protection classes are defined in the norm IEC 60529.

An IP protection class IP 67 according to DIN EN 60529 can be achieved with the receptacle connector so that the housing interior is tightly sealed against dust and protected against access with a wire, and provides protection against water in such a way that intermittent immersion is possible without the ingress of moisture.

By way of example, the base part can be an open cuboid having a closed bottom and having three sidewalls, namely a rear side wall at the rear and two face side walls on the opposing face sides. The top part is then fitted from the open top side into the chamber in the base part which is bounded by the side walls to then seal the open face side.

The invention is explained in more detail below with reference to exemplary embodiments using the attached drawings. In the drawing.

Figure 1:
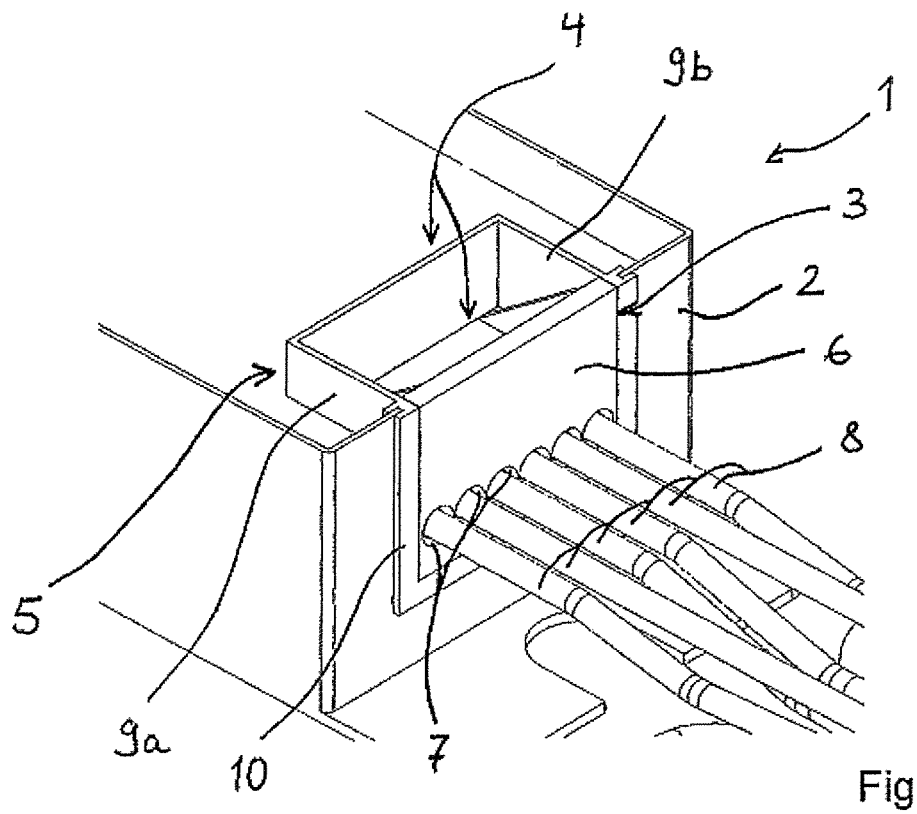
FIG. 1 shows a perspective view of a housing with receptacle connector according to a first embodiment fitted to said housing in a sealed manner.
Figure 2:
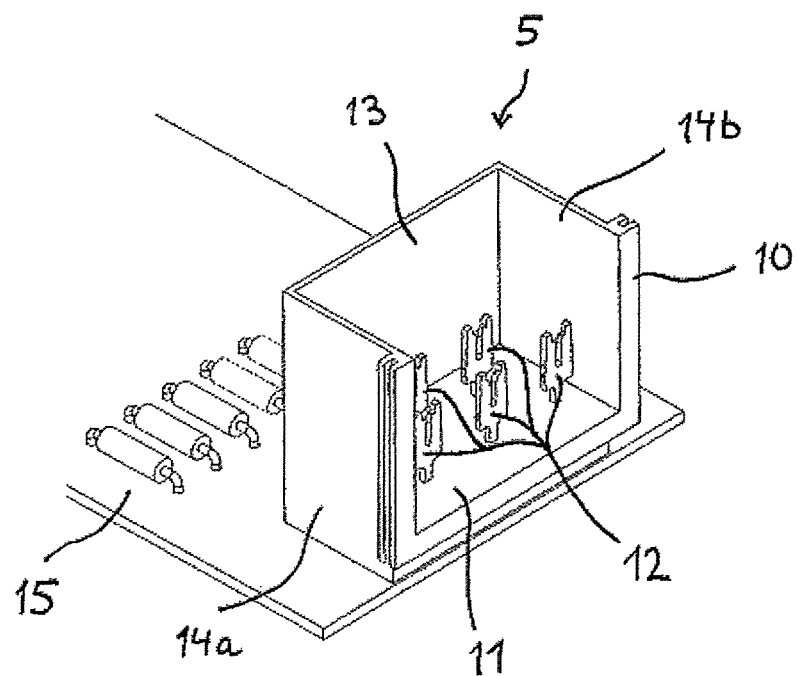
FIG. 2 shows a perspective view of the base part of the receptacle connector according to FIG. 1 in the form of a printed circuit board plug-in connector mounted on a printed circuit board.
Figure 5:
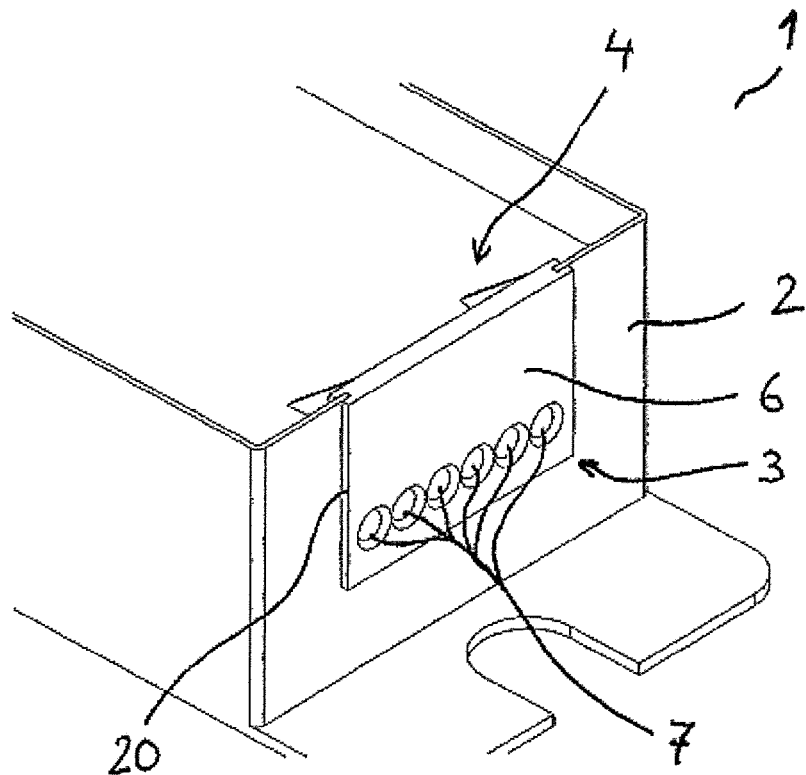
Figure 6:
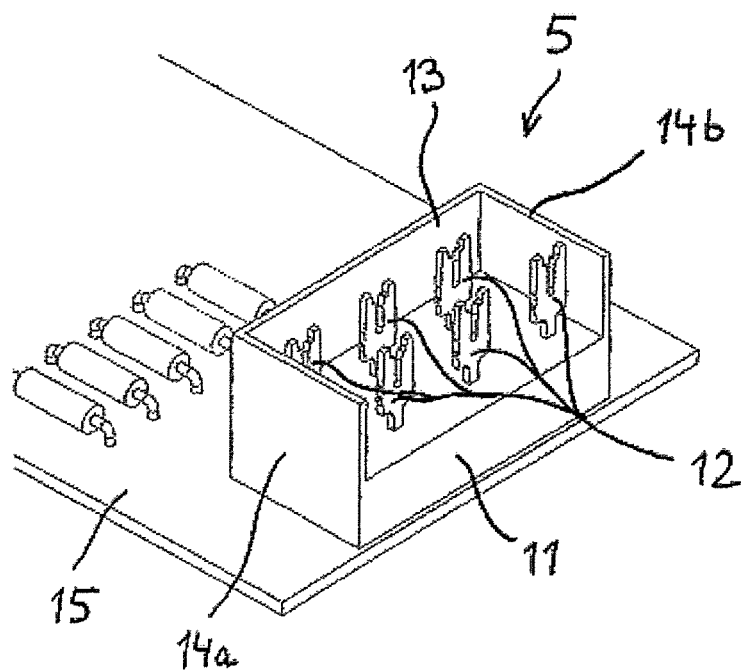
Figure 7:
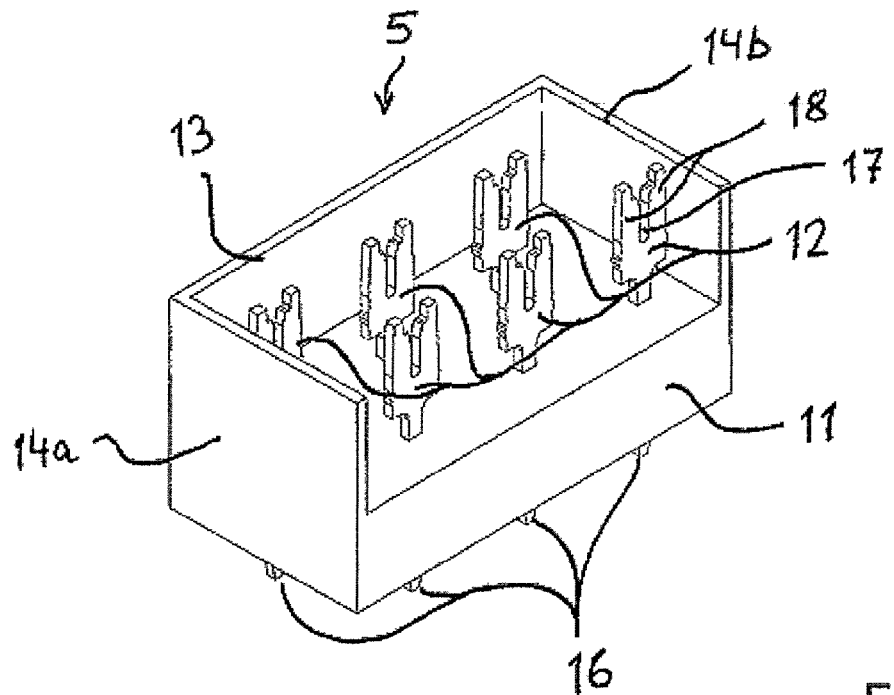
Figure 8:
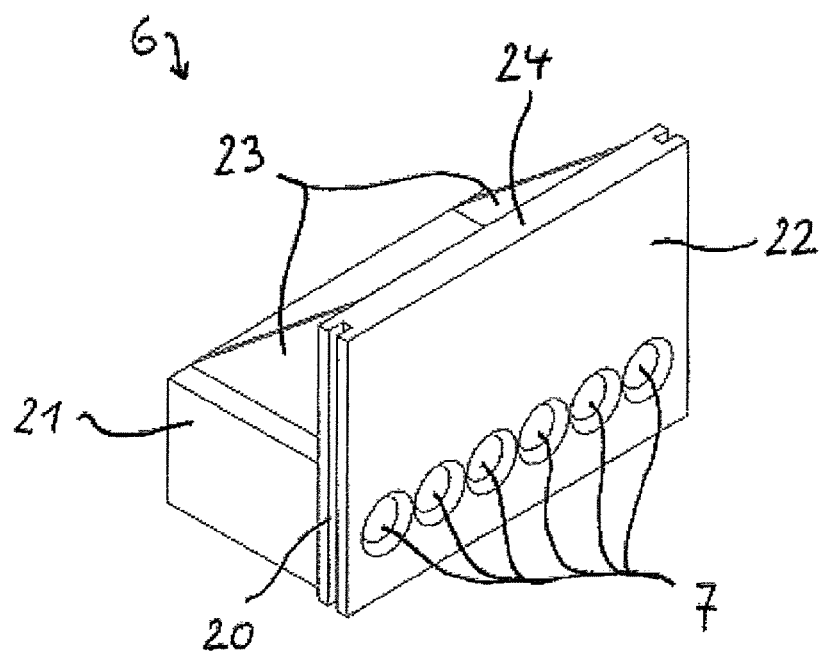
Figure 8:
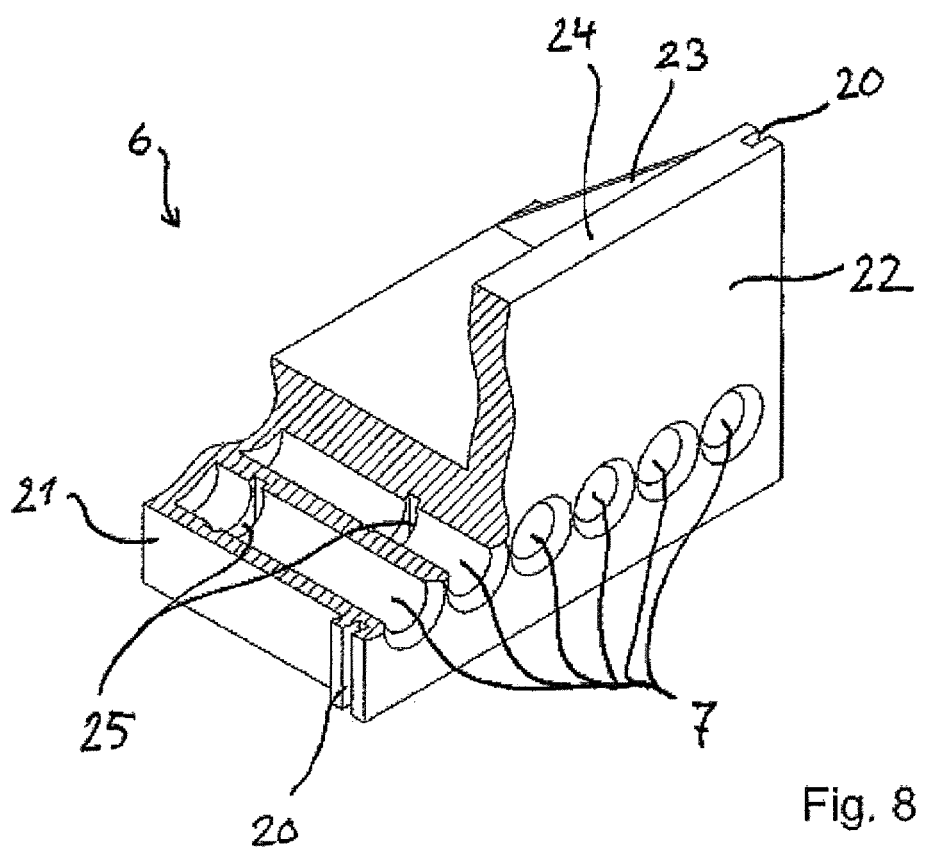

FIG. 4a) shows a perspective view of the top part of the receptacle connector from FIGS. 1 and 2;

FIG. 4b) shows a perspective view of the top part according to FIG. 4a) in partial section;

FIG. 5 shows a perspective view of a housing with receptacle connector according to a second embodiment fitted in said housing;

FIG. 6 shows a perspective view of the base part of the receptacle connector according to FIG. 5 fitted to a printed circuit board;

FIG. 7 shows a perspective view of the base part of the receptacle connector from FIGS. 5 and 6;

FIG. 8a) shows a perspective view of the top part of the receptacle connector according to FIG. 5;

FIG. 8b) shows a perspective view of the top part according to FIG. 8a) in partial section.

A perspective view of a device 1, such as a ballast unit for example, having a (device) housing 2 and a fitting opening 3 for a receptacle connector 4 can be seen in FIG. 1. The receptacle connector 4 of the first embodiment shown in FIG. 1 is designed in two parts and has a base part 5 and a top part 6. The top part 6 has a plurality of conductor infeed openings 7 for accommodating respectively associated electrical conductors 8 which can be fed into conductor accommodation openings 7.

It becomes clear that the base part 5 has a circumferential sealing lip 10 with a groove on two opposing side walls 9a, 9b and on the not visible bottom part. The housing wall edges of the housing 2 which border the accommodating opening 3 then lower into the groove of the sealing lip 10. In this way, the base part 5 is fitted into the housing 2 in a sealed manner and protects the interior of the housing 2 against environmental influences from the outside. As an example, the sealing lip 10 can be made from elastic synthetic material in order to provide an adequate sealing function to guarantee protection class IP 67. Elastic synthetic material is also understood to mean rubber material including the application of a sealing lip containing rubber out of or in a contact surface for a housing wall, which contact surface is formed from insulating material of the base part.

The top part 6 is then fitted in the free space of the base part 5 and fitted onto the base part 5 so that the electrical conductors 8 make electrically conductive contact with the help of insulation displacement contacts of the base part 5 (not shown).

A perspective view of the base part 5 from FIG. 1 can be seen in FIG. 2. It becomes clear that the base part 5 has a bottom part 11 in which the insulation displacement contacts 12 are fitted. The bottom part 11 is made from insulating material. At the same time, the insulation displacement contacts 12 are fitted into the insulating material of the base part 11 in a sealed manner, for example by being injection molded during the production of the base part 5 when the base part 5 is produced by injection molding as is usually the case.

Furthermore, it can be seen that a rear side wall 13 and two opposing side walls 14a, 14b are provided as one piece with the bottom part 11 on the two face sides and protrude at right angles from the bottom part 11. The base part 5 thus has the form of a cuboid which is open towards the top at the top side and to the front at the front side to enable the top part 6 to be fitted.

Furthermore, it becomes clear that the base part 5 is in the form of a printed circuit board plug-in contact and is fitted onto a printed circuit board 15. At the same time, the insulation displacement contacts 12 are connected to associated tracks on the printed circuit board 15, preferably by soldering.

Figure 3:
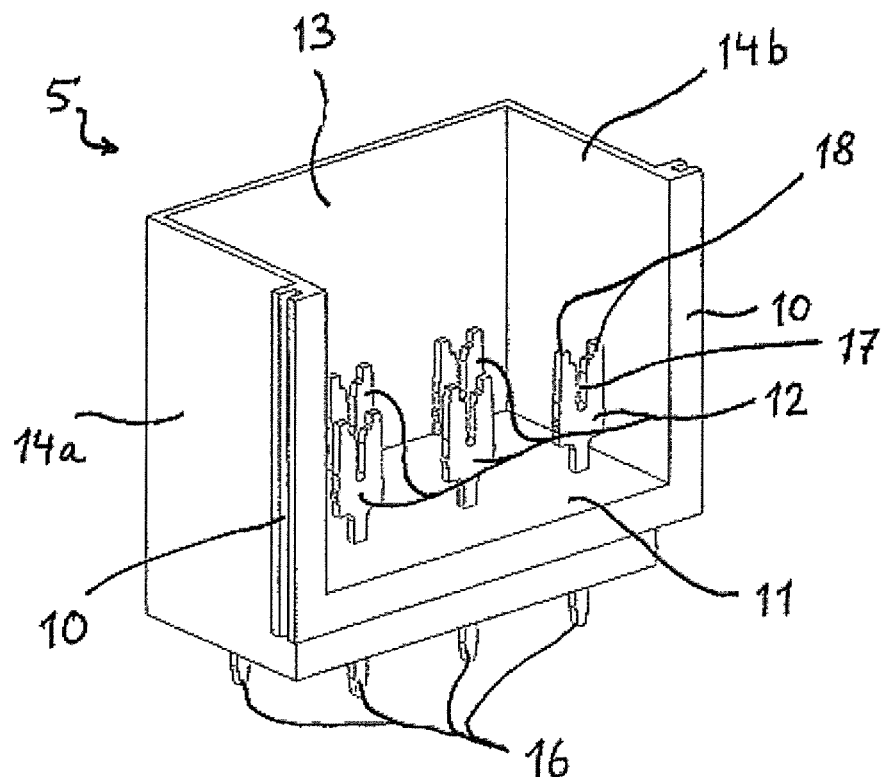
FIG. 3 shows a perspective view of the base part of the receptacle connector from FIGS. 1 and 2.

A perspective view of the base part 5 from FIGS. 1 and 2 can be seen in FIG. 3. It becomes clear that the insulation displacement contacts 12 have solder pins 16 which protrude from the bottom part and can be fitted into associated holes of the printed circuit board 15 and soldered to the tracks.

Furthermore, it can be seen that the insulation displacement contacts 12 are forked in a manner which is known per se and have a clamping slot 17 which is formed by two fork prongs 18 which are spaced apart from one another. The inner edges of the fork prongs 18 which bound the clamping slot 17 are preferably formed in a converging manner towards the open end at least in an upper partial region in order to form a cutting edge for cutting open the insulating material sleeve of an electrical conductor.

The form of the insulation displacement contacts 12 is the responsibility of the person skilled in the art, wherein he can call upon numerous known embodiments of insulation displacement contacts.

The important thing is that a sealing lip 10, which runs partially around the side walls 14a and 14b and the bottom part 11 adjacent to the front side, is provided at the front. The sealing lip 10 has a groove for accommodating a housing wall.

A perspective view of the top part 6 of the receptacle connector 4 from FIG. 1 can be seen in FIG. 4a). FIG. 4b) shows the same view in a partial section.

It is clear that a plurality of conductor infeed openings 7, into which the electrical conductors 8 can be inserted, are incorporated at the front of the top part 6. Contact accommodation openings, which in each case open out into associated conductor infeed openings 7 and which are designed for accommodating insulation displacement contacts 12 of the base part 5 when the top part 6 is fitted onto the base part 5, are provided on the underside of the top part 6. The insulation displacement contacts 12 can then lower into respectively associated contact accommodation openings 25 and produce an insulation displacement contact 12 with a particular electrical conductor 8 which is fed into the conductor infeed openings 7.

No further sealing measures are required on the top part 6, as the sealing lips of the base part 5 already protect the interior of the housing 2 against environmental influences from the outside.

However, as an option, it is conceivable that the top part 6 also has a sealing lip which runs around at least part of the outer contour of the top part 6 in order to additionally fit said top part into the base part 5 in a tightly sealed manner.

Figure 4:
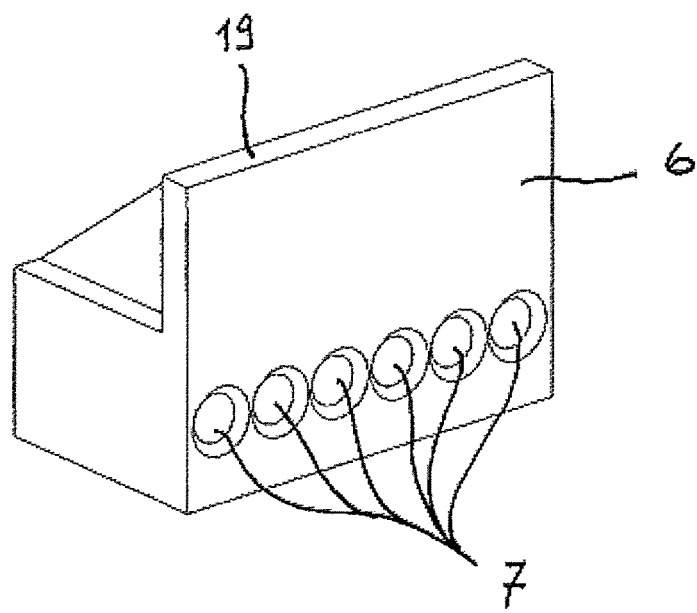
Figure 4:
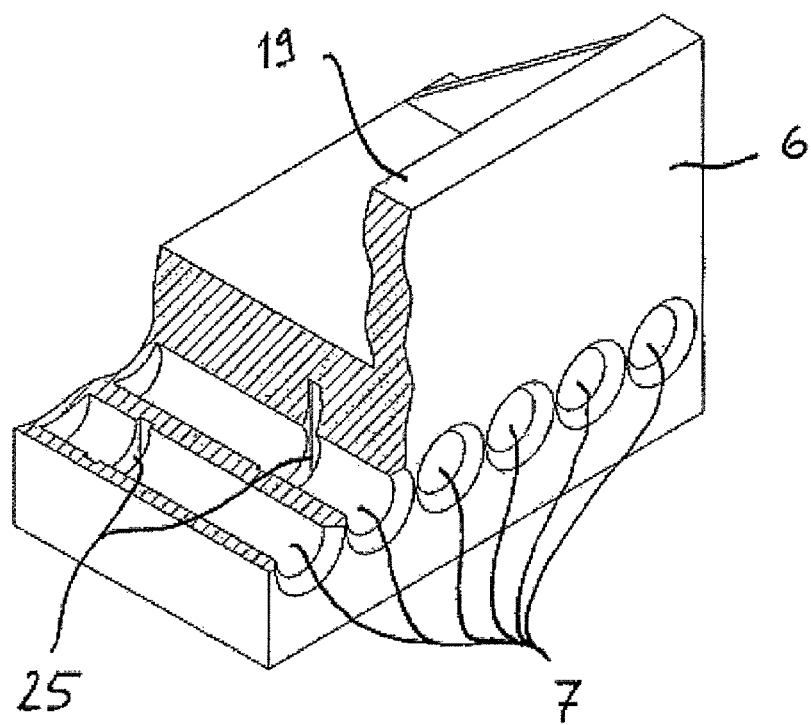

It can also be advantageous when a sealing lip with a groove corresponding to the sealing lip 10 of the base part 5 is formed at least on the top edge 19 of the top part 6 in order to enable a housing cover to be fitted in a sealed manner after the receptacle connector 1 is fitted into the housing 2. It is then advantageous when the groove of the sealing lip 10 of the base part 5 is continued upwards at the top end, i.e. at the open end at the side walls 14a, 14b. The groove of the sealing lip 10 at the top edge 19 (not shown) of the top part 6 according to FIG. 4 is then continued into the groove of the sealing lip 10 of the base part 5 in order to provide a continuous accommodating groove for accommodating a housing cover or a housing cover edge in a sealed manner.

A second embodiment of a receptacle connector 4, which is likewise fitted into a housing 2 of a device 1 in a sealed manner, can be seen in FIG. 5.

Once again, the receptacle connector 4 is designed in two parts. In this embodiment however, the interior of the housing 2 is sealed at the top part 6 with a sealing lip 20 when the top part 6 is fitted onto the base part 5. For this purpose, the sealing lip 20 is formed circumferentially adjacent to the front on the mutually opposing side edges and the bottom edge of the top part 6 with the conductor infeed openings 7. The sealing lip 20 is again in the form of a groove, into which the housing wall edges of the housing 2 which border the accommodating opening 3, lower.

A perspective view of the base part 5 of the receptacle connector 4 from FIG. 5 can be seen in FIG. 6. The base part 5 is again designed as a printed circuit board plug-in connector and is intended for fitting and soldering onto a printed circuit board 15. The base part 5 again has a bottom part 11 and boundary walls which are formed integrally with the bottom part 11 from the same insulating material. In this way, face side walls 14a, 14b are provided on the mutually opposing face sides at the rear of a rear side wall 13. The base part 5 is therefore once again in the form of a cuboid and open at the top side and front side for accommodating the top part 6.

It becomes clear that insulation displacement contacts 12 are also fitted into the bottom part 11 in a sealed manner in this embodiment of the base part 5.

Unlike the first embodiment of the receptacle connector 4, the base part 5 of the second embodiment has no sealing elements.

A perspective view of the base part 5 from FIG. 6 can be seen in FIG. 7. It becomes clear that the insulation displacement contacts 12 again have solder pins 16 which protrude downwards from the bottom part 11 for inserting into holes of a printed circuit board 15 and soldering to associated tracks on the printed circuit board 15.

A perspective view of the top part 6, which is likewise made of insulating material, e.g. by plastic injection molding, can be seen in FIG. 8a). The top part 6 has a base body 21 in which the conductor infeed openings 7 are formed. It becomes clear from the partial view according to FIG. 8b) that contact accommodation openings 25 feed into the base body 21 from the underside of the base body 21. The contact accommodation openings 25 open out into associated conductor infeed openings 7 and are provided for accommodating associated insulation displacement contacts 12. When the top part 6 is fitted onto the base part 5, the insulation displacement contacts 12 therefore lower into the associated contact accommodation openings 25 and pass into the associated conductor infeed opening 7 where they make an insulation displacement connection with an associated electrical conductor 8 which is fed into the corresponding conductor infeed opening 7.

A front plate 22, which is formed integrally with the base body 21 and is supported on the base body 21 by means of supporting webs 23, is provided at the front of the top part 6. The sealing lip 20 in the form of a groove of a front plate 22 is formed on the mutually opposing side edges and the bottom edge so that the top part 6 can be fitted into an accommodation opening 3 of a housing 2 in a sealed manner. For this purpose, the housing wall edges which border the accommodation opening 3 of the housing 2 for the top part 6, lower into the groove of the sealing lip 20.

In the exemplary embodiments shown, the sealing lips 10, 20 are in the form of a U-shaped groove. However, other embodiments which ensure an adequately sealed contact of the receptacle connector 4 with the housing wall which borders the accommodation opening 3 of the housing 2, are also conceivable. It can therefore also be sufficient when the sealing lip is L-shaped and the sealing function is ensured by a wall section which overlaps the housing.

However, it is also conceivable that the sealing lip is realized by a separate plastic material which is connected to the base part 5 and/or the top part 6. For example, a two-component injection molding process, in which elastic rubber material is injection-molded onto the insulating material from which the base part 5 and the top part 6 are manufactured, is suitable here.

With the second exemplary embodiment, it is also conceivable that the sealing lip 20 is continued at the top edge 24 of the front plate 22 of the top part 6 in order to also enable a housing cover to be accommodated in a sealed manner.

The invention claimed is:

1. A receptacle connector, comprising:
   a base part including at least one insulation displacement contact for making electrical contact with an electrical conductor;
   a top part including at least one conductor infeed opening for receiving the electrical conductor; and
   at least one contact accommodation opening configured to open out into an associated conductor infeed opening to accommodate the insulation displacement contact of the base part when the top part is fitted onto the base part, wherein
   the receptacle connector is designed to fit into a housing, and at least one of the base part or the top part includes a sealing lip having a contour matched to an associated housing wall in order to fit at least one of the base part or the top part into the housing wall in a sealed manner.

2. The receptacle connector according to claim 1, wherein the base part includes a base body comprising electrically insulating plastic having a bottom part and having side walls which protrude from the bottom part, wherein the at least one insulation displacement contact is fitted into the bottom part and protrudes from the bottom part, and wherein the sealing lip of the base part is arranged circumferentially on at least part of the outer wall of the bottom part and on the outer wall of the side walls, the sealing lip enabling the base body to be fitted into a housing wall in a sealed manner.

3. The receptacle connector according to claim 1, wherein the base part includes a base body comprising electrically insulating plastic and having a bottom part, wherein the at least one insulation displacement contact is fitted into the bottom part and protrudes from the bottom part, and wherein the sealing lip of the top part is arranged circumferentially on at least part of the outer wall of the top part, the sealing lip enabling the top part to be fitted into a housing wall in a sealed manner.

4. The receptacle connector according to claim 1, wherein the at least one conductor infeed opening comprises circumferential elastic sealing lips.

5. The receptacle connector according to claim 1, wherein the base part comprises a cuboid open on two sides, the cuboid including a closed bottom, a rear side wall at the rear end, and two mutually opposing face side walls,
  wherein the top part is fitted from the open top side into a chamber in the base part to seal the open front side, the chamber bounded by the side walls.

6. A receptacle connector, comprising
  a base part including at least one insulation displacement contact for making electrical contact with an electrical conductor;
  a top part including at least one conductor infeed opening for receiving the electrical conductor with which contact is to be made; and
  at least one contact accommodation opening configured to open out into an associated conductor infeed opening to accommodate the insulation displacement contact of the base part when the top part is fitted onto the base part;
  wherein the receptacle connector is configured to fit into a housing, and
  wherein one or more of the base part and the top part include a sealing lip having a contour matched to an associated housing wall in order to fit at least one of the base part or the top part into the housing wall in a sealed manner.

7. The receptacle connector according to claim 6, wherein the base part includes a base body comprising electrically insulating plastic having a bottom part and side walls which protrude from the bottom part,
  wherein the at least one insulation displacement contact is fitted into the bottom part and protrudes from the bottom part, and
  wherein the sealing lip of the base part is arranged circumferentially on at least part of the outer wall of the bottom part and on the outer wall of the side walls, the sealing lip enabling the base body to be fitted into a housing wall in a sealed manner.

8. The receptacle connector according to claim 6, wherein the base part includes a base body comprising electrically insulating plastic having a bottom part,
  wherein the at least one insulation displacement contact is fitted into the bottom part and protrudes from the bottom part, and
  wherein the sealing lip of the top part is arranged circumferentially on at least part of the outer wall of the top part, the sealing lip enabling the top part to be fitted into a housing wall in a sealed manner when the top part is fitted onto the base part.

9. The receptacle connector according to claim 6, wherein the conductor infeed openings comprise circumferential elastic sealing lips.

10. The receptacle connector according to claim 6, wherein the base part comprises a cuboid open on two sides, the cuboid including a closed bottom, a rear side wall at a rear end, and two mutually opposing face side walls,
  wherein the top part is fitted from the open top side into a chamber in the base part to seal the open front side, the chamber bounded by the side walls.

* * * * *